(12) United States Patent
Tu

(10) Patent No.: US 8,247,868 B2
(45) Date of Patent: Aug. 21, 2012

(54) POWER MOSFET AND FABRICATING METHOD THEREOF

(75) Inventor: Kou-Way Tu, Zhonghe (TW)

(73) Assignee: Niko Semiconductor Co., Ltd., Taipei (TW)

( * ) Notice: Subject to any disclaimer, the term of this patent is extended or adjusted under 35 U.S.C. 154(b) by 262 days.

(21) Appl. No.: 12/403,893

(22) Filed: Mar. 13, 2009

(65) Prior Publication Data

US 2010/0155840 A1 Jun. 24, 2010

(30) Foreign Application Priority Data

Dec. 19, 2008 (TW) .............................. 97149833 A

(51) Int. Cl.
*H01L 29/78* (2006.01)
*H01L 29/66* (2006.01)
(52) U.S. Cl. .................. 257/333; 257/342; 257/E29.26
(58) Field of Classification Search .................. 257/330, 257/331, 333, 342, E29.26 E
See application file for complete search history.

(56) References Cited

U.S. PATENT DOCUMENTS

| | | | | |
|---|---|---|---|---|
| 7,129,544 | B2 * | 10/2006 | Hadizad | 257/348 |
| 7,470,953 | B2 * | 12/2008 | Takaya et al. | 257/330 |
| 2006/0214222 | A1 * | 9/2006 | Challa et al. | 257/328 |
| 2009/0085107 | A1 * | 4/2009 | Hshieh | 257/331 |

* cited by examiner

*Primary Examiner* — Matthew Landau
*Assistant Examiner* — Daniel Luke
(74) *Attorney, Agent, or Firm* — Birch, Stewart, Kolasch & Birch, LLP

(57) ABSTRACT

A power MOSFET is disclosed. In the power MOSFET, an epitaxial layer doped with dopants of a first conduction type is formed on a substrate. A first trench extends downward from a first region of the top surface of the epitaxial layer, and a second trench extends downward from the bottom of the first trench. The width of the second trench is smaller than that of the first trench. The first well is located adjacent to the bottom of the first trench and the bottom of the second trench, and is doped with dopants of a second conduction type. The second well extends downward from a second region of the top surface and is doped with dopants of the second conduction type. The first well and the second well are separated. A source region doped with dopants of the first conduction type is formed in the second well.

5 Claims, 7 Drawing Sheets

POWER MOSFET AND FABRICATING METHOD THEREOF

BACKGROUND OF THE INVENTION

1. Field of the Invention

The present invention generally relates to a power semiconductor device, and more particularly, to the power metal-oxide-semiconductor field effect transistor (MOSFET) and the fabricating method thereof which can efficiently decrease the cost of manufacturing equipments and process.

2. Description of the Prior Art

As everyone knows, energy issue is a tough challenge in every part of the world. Many countries have set strict standards and schedules in order to improve energy efficiency. Nowadays, energy loss of electronic products can not be avoided in our everyday life. From AC/AC transformation of power stations, AC/DC/AC transformation of transformer stations, AC/DC/AC transformation of various drives, to indoor AC/DC power supply and DC/DC voltage conversion of terminal products, every single segment will induce energy loss. Particularly, the more segments are encountered, the more energy is lost. There may be up to 90% of energy lost during the transmission of electricity from the power station to the terminal product.

Thereby, semiconductor companies constructively develop new semiconductor structure to improve efficiency of electricity and reduce energy loss. By doing so, not only the energy waste can be slashed, but the purpose of environmental protection can also be reached. Among these semiconductor structures, the development of high efficiency power semiconductor devices plays an important role. Nowadays, many power semiconductor products, such as CoolMOS of Infineon, DTMOS of Toshiba, etc., which feature a super-junction structure to provide extremely low energy loss in both static and dynamic state, are available in the market. These power semiconductor products could be applied to various usages, such as high efficiency switching power supplies, renewable energy conversion equipment, LCD televisions, solar power systems, large power supply of computers and lighting systems, etc.

Although the power semiconductor products have good energy efficiency, the fabrication method thereof usually needs complicated and expensive processes for manufacturing these power semiconductor products. It is nard to lower the manufacturing cost. Thus, the price of these products is hard to decrease, which badly affects the willing for the consumers to purchase these high efficiency products and also seriously affects the achievement of the objects of environmental protection and energy conservation all over the world.

Accordingly, the main object of the present invention is to provide a power MOSFET and fabricating method thereof to solve the problems mentioned above.

SUMMARY OF THE INVENTION

A power MOSFET and a fabricating method thereof are provided in the present invention. The power MOSFET of the present invention features good energy efficiency not less than the typical high efficiency power MOSFET available in the market but can be fabricated without the need of complicated processes or expensive equipments. Thus, the power MOSFET of the invention has a great potential on the market because the manufacturing cost of the power MOSFET can be efficiently decreased.

According to a first embodiment of the invention, the power MOSFET comprises a substrate, an epitaxial layer, a first trench, a second trench, a first well, a second well, and a source region. The epitaxial layer is located on the substrate and is doped with dopants of a first conduction type. The first trench is extended downward from a first region of a top surface of the epitaxial layer. The second trench is extended downward from the bottom of the first trench. The width of the second trench is smaller than the width of the first trench. The first well is located at the bottom of the first trench and the bottom of the second trench and is doped with dopants of a second conduction type. The second well is extended downward from a second region of the top surface and is doped with dopants of the second conduction type. The first well is separated from the second well. The source region is located in the second well and is doped with dopants of the first conduction type.

According to a second embodiment of the invention, a method for fabricating a power MOSFET is provided. In this embodiment, the fabricating method comprises the steps of: (a) growing an epitaxial layer on a substrate, wherein the epitaxial layer is doped with dopants of a first conduction type; (b) forming a first trench extending downward from a first region of a top surface of the epitaxial layer; (c) forming a second trench extending downward from the first trench, wherein the width of the second trench is smaller than the width of the first trench; (d) implanting dopants of a second conduction type to the bottom of the first trench and the bottom of the second trench to form a first well; (e) forming a second gate dielectric layer in the second trench; (f) forming a first gate dielectric layer in the first trench; (g) filling the first trench with a conductive material to form a gate region; (h) forming a second well, which is doped with dopants of the second conduction type, extending downward from a second region of the top surface; and (i) forming a source region in the second well, wherein the source region is doped with dopants of the first conduction type.

The objective of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

Figure 3:
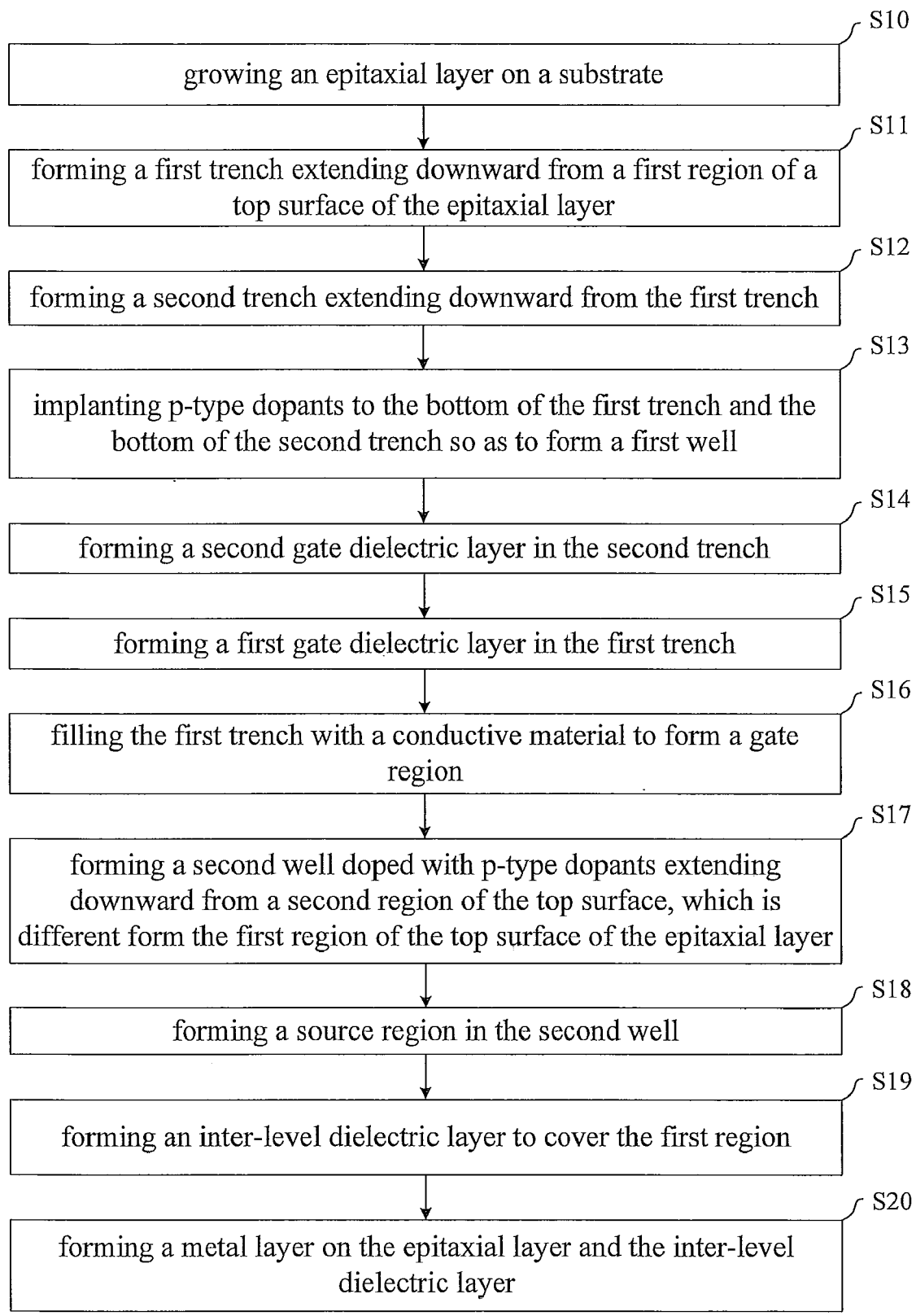
FIG. 3 is a flowchart showing the power MOSFET fabricating method according to the second embodiment of the invention.

FIG. 4(A)~FIG. 4(H) are cross section views showing the semiconductor structures corresponding to the steps of the fabricating method of FIG. 3.

DETAILED DESCRIPTION OF THE INVENTION

Figure 1:
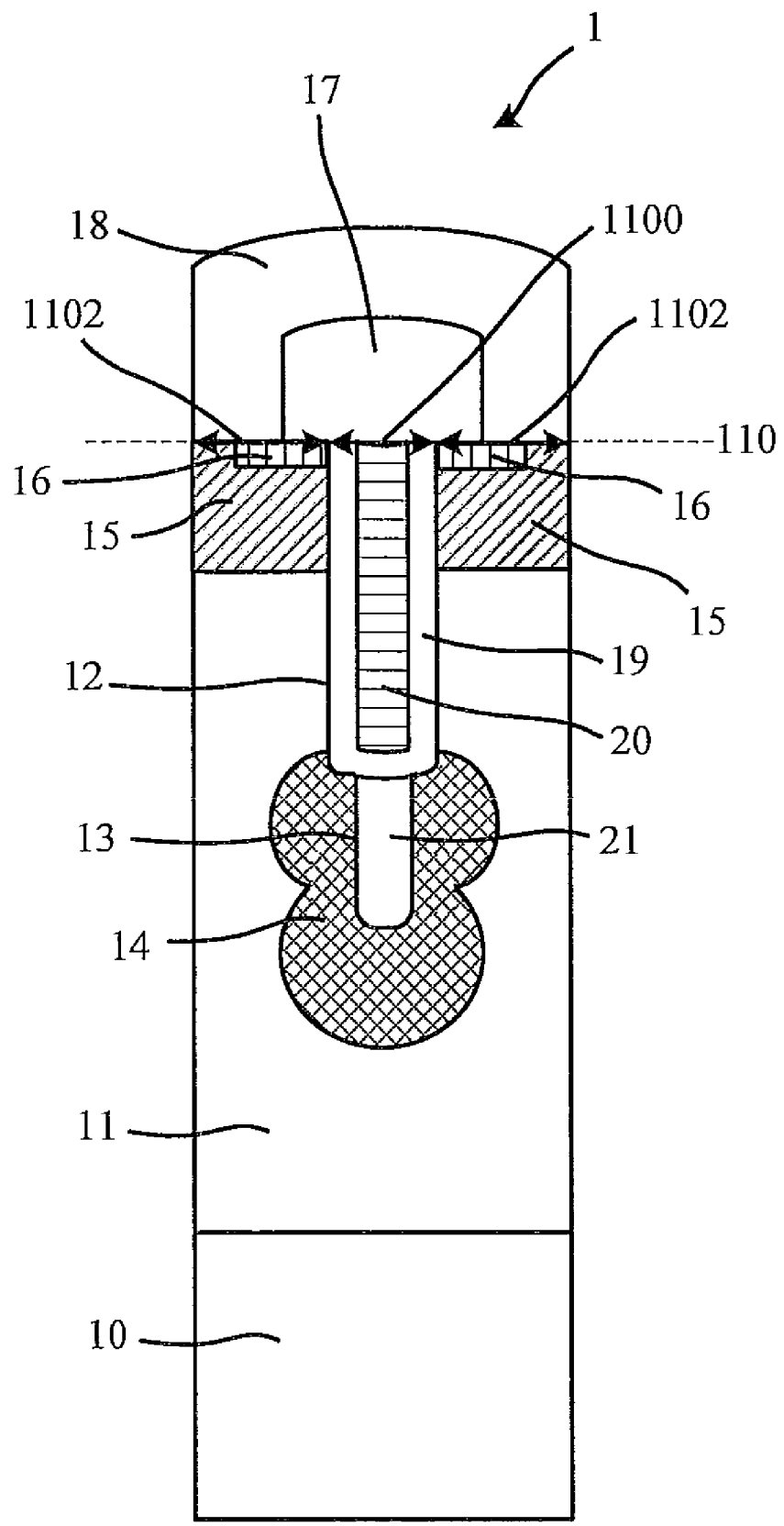
FIG. 1 shows a cross section view of the structure of the power MOSFET in the first embodiment of the present invention.

FIG. 1 shows a cross section view of the structure of the power MOSFET in the first embodiment of the invention. As shown in FIG. 1, the structure of the power MOSFET 1 includes a substrate 10, an epitaxial layer 11, a first trench 12, a second trench 13, a first well 14, a second well 15, a source region 16, an inter-level dielectric layer 17, and a metal layer 18. Each part of the structure of the power MOSFET 1 would be introduced in detail as follows.

Firstly, the substrate 10 of the power MOSFET 1 is introduced. In this embodiment, the substrate 10 is a silicon substrate with high concentration n-type dopants. The drain region of the power MOSFET 1 is regarded as located on the substrate 10. The conduction type, the concentration of the dopants, and the types of the substrate 10 are not meant to restrict the range of the present invention.

In this embodiment, the epitaxial layer 11 is grown on the substrate 10 by using an epitaxial growth method. Compared to the substrate 10, the epitaxial layer 11 is doped with lower concentration n-type dopants. However, the scope of the present invention is not limited there to.

Then, the first trench 12 and the second trench 13 are introduced. As shown in FIG. 1, the first trench 12 is extended downward from a first region 1100 of the top surface 110 of the epitaxial layer 11. The second trench 13 is further extended downward from the first trench 12. The width of the second trench 13 is smaller than the width of the first trench 12. In practice, the width of the second trench 13 is approximately in a range of 40% to 80% of the width of the first trench 12. The depth of the second trench 12 is approximately in a range of 20% to 50% of the depth of the first trench 12. However, the present invention is not limited there to. With the development of semiconductor manufacturing technology, the width of the second trench 13 can be further scaled down and the depth of the second trench 13 can be further increased.

In this embodiment, a first gate dielectric layer 19 and a gate region 20 composed of conductive material are formed in the first trench 12, wherein the first gate dielectric layer 19 covers the inner wall of the first trench 12, and the gate region 20 is located in the space encircled by the first gate dielectric layer 19. A second gate dielectric layer 21 is formed in the second trench 13. As a preferred embodiment, the first gate dielectric layer 19 and the second gate dielectric layer 21 may be composed of identical material, such as silicon oxide, the first gate dielectric layer 19 and the second gate dielectric layer 21 may be formed in the same fabrication step, and the gate region 20 may be composed of doped poly-silicon. In addition, in this embodiment, the second gate dielectric layer 21 is merely located in the second trench 13. However, the present invention is not limited to this. The second gate dielectric layer 21 may fill the second trench 13 and further extend upward to cover the bottom of the first trench 12.

Then, the first well 14 is introduced. As shown in FIG. 1, the first well 14 is located at the bottom of the first trench 12 and the bottom of the second trench 13, and the doping profile of the first well 14 shows a shape of calabash. In detail, the first well 14 is extended from the bottom of the first trench 12, along the sidewall of the second trench 13 toward the bottom of the second trench 13, and further covers the bottom of the second trench 13. In addition, the first well 14 has a larger width at the depth corresponding to the bottom of the first trench 12 and the bottom of the second trench 13. In this embodiment, the first well 14 is doped with p-type dopants, which is contrary to that of the epitaxial layer 11.

In practice, a diffusion process is carried out after the p-type dopants has been implanted to the bottom of the first trench 12 and the bottom of the second trench 13. It should be noticed that because the structure of the power MOSFET 1 has the first trench 12 and the second trench 13, therefore, p-type dopants can be implanted to the bottom of the first trench 12 and the bottom of the second trench 13, which is much deeper than the bottom of the first trench 12, in one ion implantation step, so as to form the first well 14 extending from the bottom of the first trench 12 to the position below the second trench 13. Additionally, because of the formation of the second trench 13, only slight ion implantation energy is needed to implant p-type dopants to a depth much deeper than the bottom of the first trench 12.

The second well 15 extends downward from a second region 1102 of the top surface 110 of the epitaxial layer 11. The first region 1100 is different from the second region 1102 but is adjacent to the second region 1102. In addition, the second well 15 and the first well 14 are separated. In this embodiment, the depth of the second well 15 is substantially smaller than a half of the depth of the first trench 12, and the second well 15 is doped with p-type dopants. It should be noticed that the second well 15 and the first well 14 must have the same conduction type, but not limited to p-type.

The source region 16 is located in the second well 15, and the source region 16 is doped with n-type dopants. The inter-level dielectric layer 17 covers the first region 1100. The metal layer 18 is formed on the epitaxial layer 11 and the inter-level dielectric layer 17, and connects to the source region 16 through the inter-level dielectric layer 17. The inter-level dielectric layer 17 can be composed of undoped silicate glass (USG) or boron phosphate silicon glass (BPSG).

Figure 2:
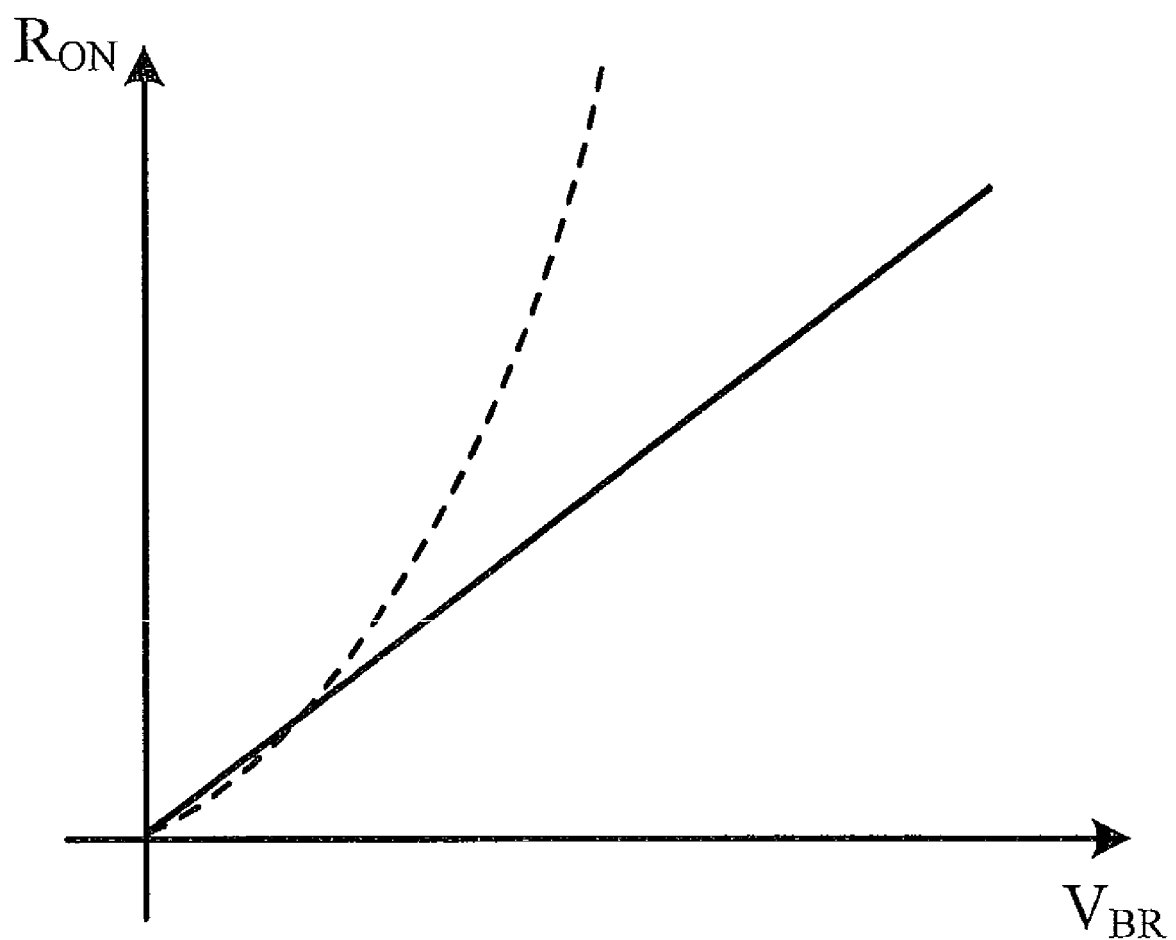
FIG. 2 is a diagram showing a relationship between on-resistance ($R_{ON}$) and breakdown voltage ($V_{BR}$) of the power MOSFET according to the first embodiment of the invention.

FIG. 2 is a diagram showing a relationship between on-resistance value $R_{ON}$ and breakdown voltage $V_{BR}$ of the power MOSFET 1 according to the first embodiment of the invention. Wherein, on-resistance value ($R_{ON}$) refers to the resistance between the drain and the source when the power MOSFET is turned on. It is understood that on-resistance value ($R_{ON}$) of the power MOSFET approximately equals to the sum of the epitaxial layer resistance value ($R_{epi}$) and the channel resistance value ($R_{channel}$). As the dotted line in FIG. 2 shows, for the conventional power MOSFET, because the thickness of epitaxial layer is un-proportionally increased with the increasing of breakdown voltage, the epitaxial layer resistance value ($R_{epi}$) is significantly increased, so that the overall on-resistance value ($R_{ON}$) of the conventional power MOSFET must be sharply raised.

On the other hand, as the solid line in FIG. 2 shows, instead of being increased sharply with the increasing of breakdown voltage ($V_{BR}$), the relationship between on-resistance value ($R_{ON}$) and breakdown voltage ($V_{BR}$) of the power MOSFET 1 in accordance with the present invention approaches an ideal linear relationship when the breakdown voltage is increased.

According to a second embodiment of the present invention, a method of fabricating a power MOSFET is provided. FIG. 3 is a flowchart showing the power MOSFET fabricating method. FIG. 4(A)~FIG. 4(H) are cross section views showing the semiconductor structures corresponding to the steps of the fabricating method of FIG. 3. As shown in FIG. 3, firstly, step S10 is performed to grow an epitaxial layer 11 on a substrate 10, wherein the epitaxial layer 11 is doped with dopants of a first conduction type.

In this embodiment, the substrate 10 is a silicon substrate doped with high concentration n-type dopants. The drain region of the power MOSFET 1 may be regarded as located on the substrate 10. The conduction types, the concentration of the dopants, and the types of the substrates 10 are not meant to restrict the scope of the present invention. In addition, in step S10, the epitaxial layer 11 is formed on the substrate 10 by using an epitaxial growth method. Compared to the substrate 10, the epitaxial layer 11 is doped with lower concentration of n-type dopants. However, the present invention is not limited there to.

Next, step S11 is performed to form a first trench 12 extending downward from a first region 1100 of a top surface 110 of the epitaxial layer 11. Practically, referring to FIG. 4(A), in step S11, the first region 1100 of the epitaxial layer 11 is etched downward by using reactive ion etching or the like to form the first trench 12 in the epitaxial layer 11.

Then, step S12 is performed to form a second trench 13 extending downward from the first trench 12, wherein the width of the second trench 13 is smaller than the width of the first trench 12. In practice, referring to FIG. 4(B), a spacer 23, which is shown by the slope line, is formed on the sidewall of the first trench 12 to define the location of the second trench 13, and then the bottom of the first trench 12 is etched through the spacer 32 to form the second trench 13. The spacer 23 can be composed of silicon oxide ($SiO_2$), but not limited to this. The width of the second trench 13 is approximately in a range of 40% to 80% of the width of the first trench 12, the depth of the second trench 13 is approximately in a range of 20% to 50% of the depth of the first trench 12, but the present invention is not limited there to.

Figure 4A:
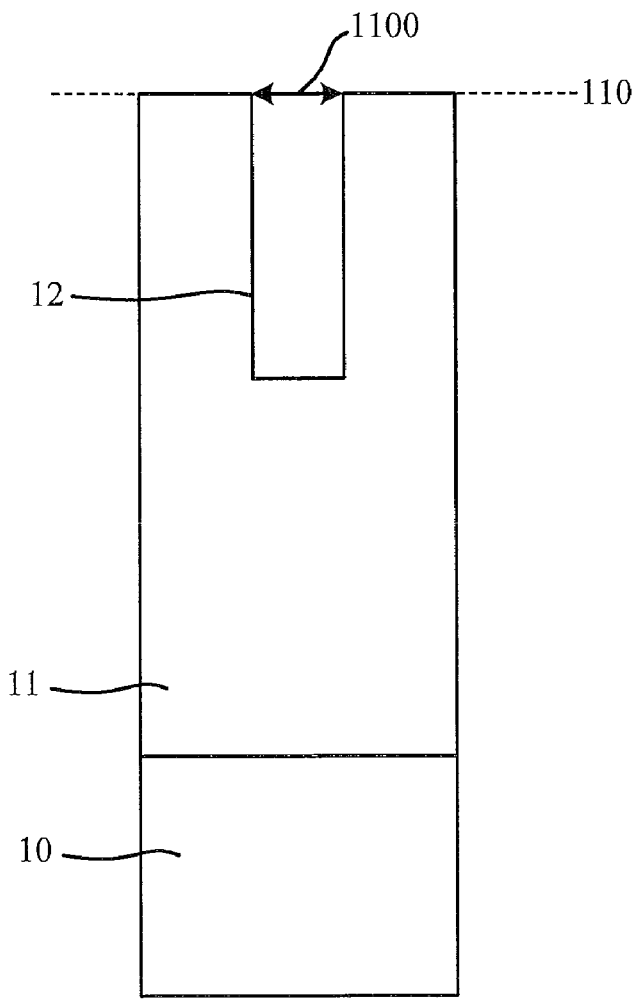
Figure 4B:
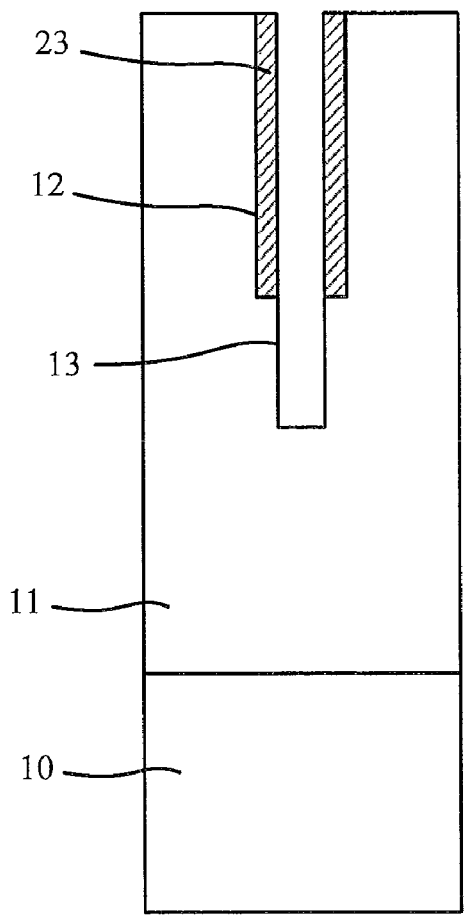
Figure 4C:
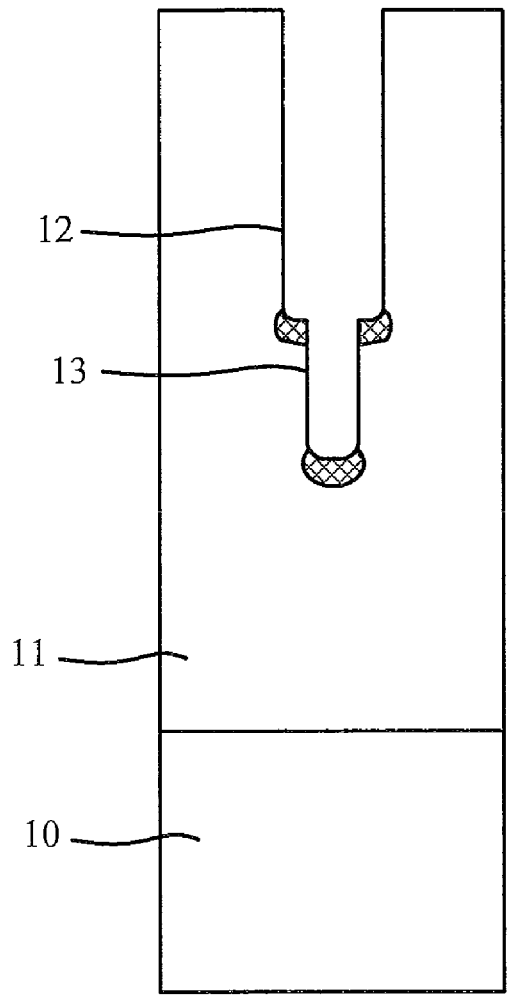

Next, referring to FIG. 4(C), step S13 is preformed to implant p-type dopants to the bottom of the first trench 12 and the bottom of the second trench 13 so as to form the first well 14. The slope line in FIG. 4(C) indicates the region with implanted p-type dopants. In practice, the dopants implanted to the bottom of the first trench 12 and the dopants implanted to the bottom of the second trench 13 form the first well 14 with a doping profile of approximately calabash after subsequent diffusion process. As shown in FIG. 4(C), the first well 14 extends from the bottom of the first trench 12 along the sidewall of the second trench 13 to cover the bottom of the second trench 13. In addition, the first well 14 has a larger width at the depth corresponding to the bottom of the first trench 12 and the bottom of the second trench 13.

Figure 4D:
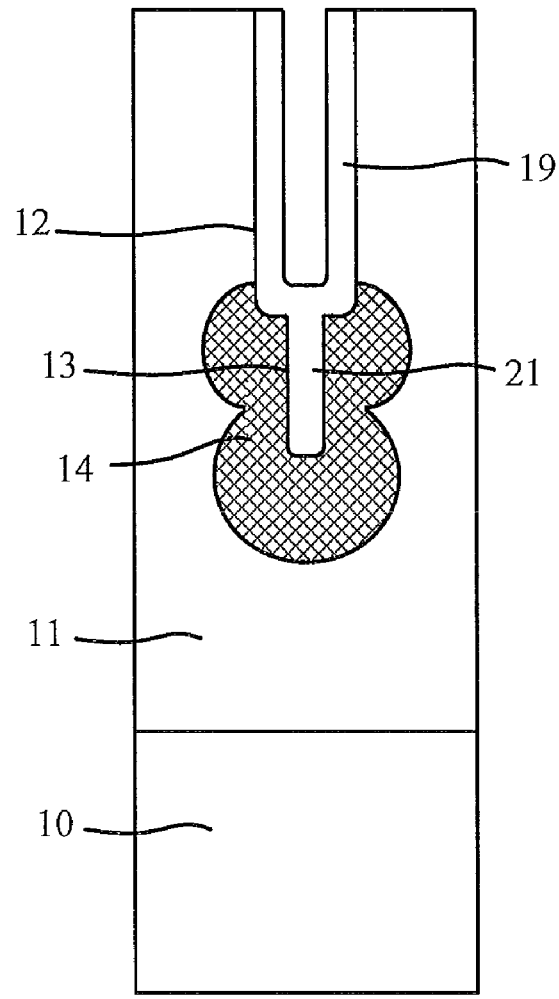

Afterward, steps S14 and S15 are preformed to form a second gate dielectric layer 21 in the second trench 13 and a first gate dielectric layer 19 in the first trench 12. In the present embodiment, the second gate dielectric layer 21 fills the second trench 13 and covers the bottom of the first trench 12. The second gate dielectric layer 21 and the first gate dielectric layer 19 can be formed by using the same insulation material (e.g., $SiO_2$), and step S14 and step S15 can be preformed to form the second gate dielectric layer 21 and the first gate dielectric layer 19 simultaneously. For example, by using the thermal oxidation process, a silicon oxide layer can be grown on the inner wall of the first trench 12 and the inner wall of the second trench 13 simultaneously. As shown in FIG. 4(D), when the thickness of the silicon oxide layer growing toward the inner space of the second trench 13 is larger than a half of the width of the second trench 13, the silicon oxide layer will fully fill the second trench 13.

Figure 4E:
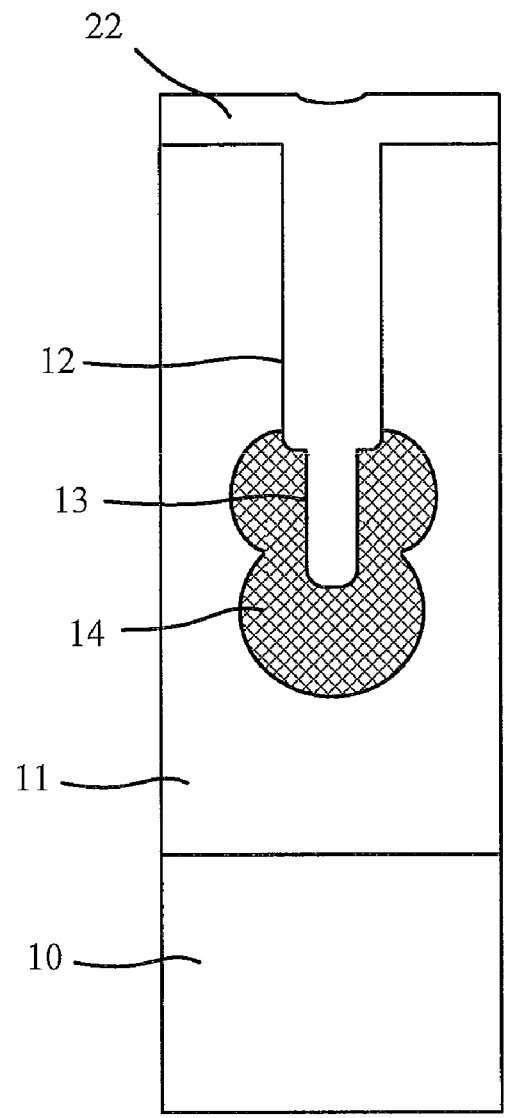
Figure 4F:
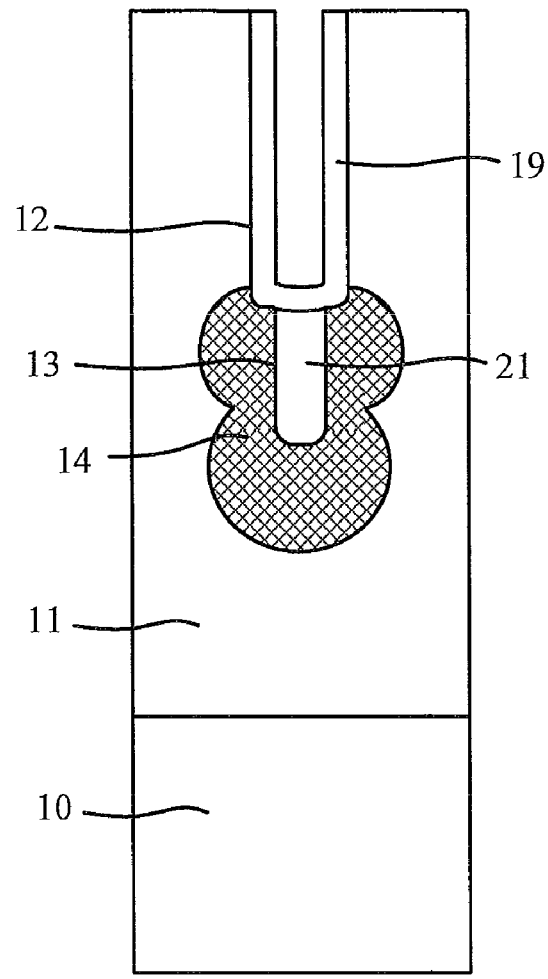

According to another embodiment of the present invention, the second gate dielectric layer 21 can be formed in the second trench 13 by deposition. Referring to FIG. 4(E), the dielectric material layer 22 is deposited in the first trench 12 and the second trench 13. Afterward, referring to FIG. 4(F), the etch-back process is used to remove the unnecessary part of dielectric material layer 22 to form the second gate dielectric layer 21 in the second trench 13. Then, the first gate dielectric layer 19 is formed in the first trench 12. As mentioned, in the present embodiment, the second gate dielectric layer 21 is firstly formed in the second trench 13, and then the first gate dielectric layer 19 is formed in the first trench 12.

Figure 4G:
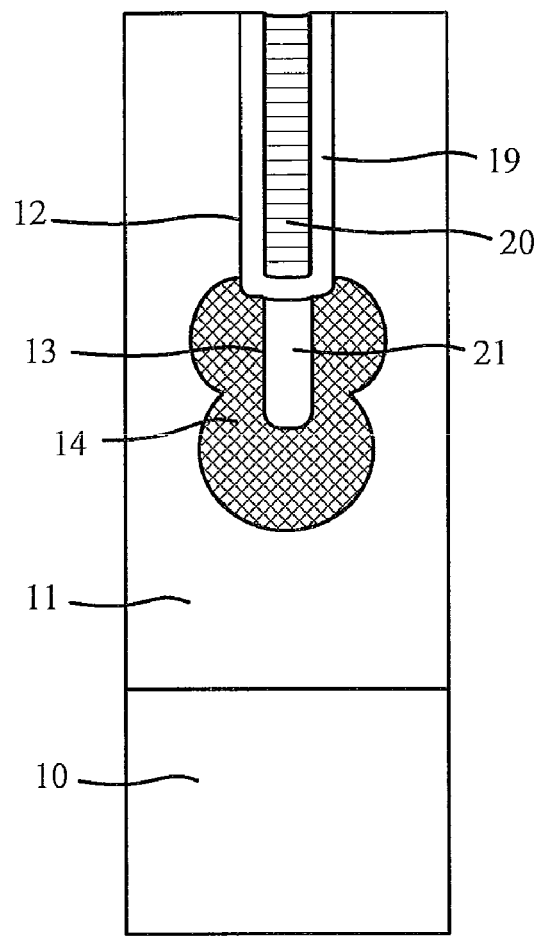
Figure 4H:
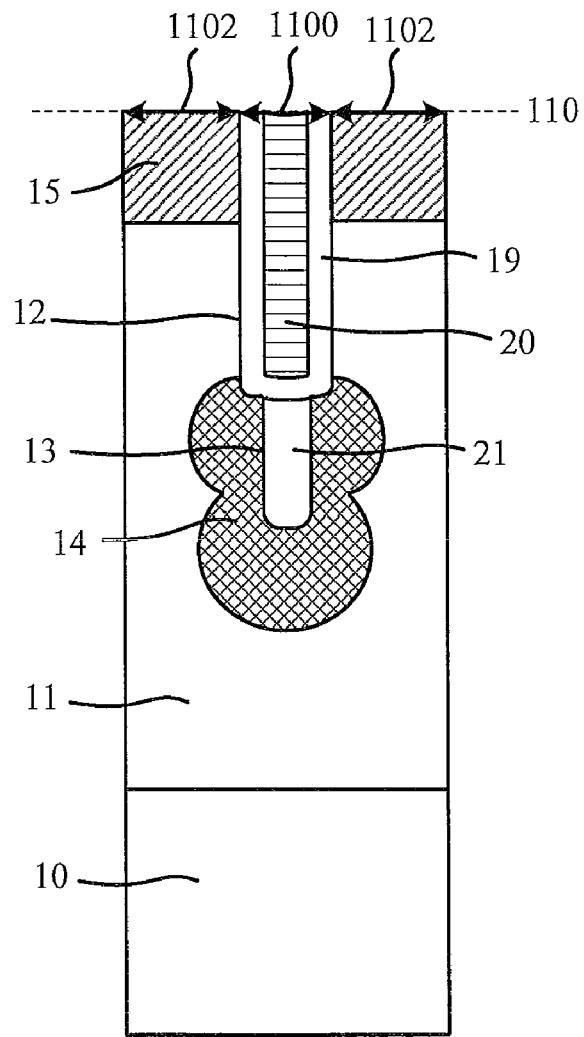

Then, as shown in FIG. 4(G), step S16 is preformed to fill the first trench 12 with conductive material (such as doped poly-silicon) to form a gate region 20. After the gate region 20 is formed, also referring to FIG. 4(H), step S17 is preformed to form a second well 15 doped with p-type dopants extending downward from a second region 1102 of the top surface 110, which is different from the first region 1100 of the top surface 110 of the epitaxial layer 11. In this embodiment, the second region 1102 is adjacent to the first region 1100, the second well 15 and the first well 14 are separated, and the depth of the second well 15 is substantially smaller than a half of the depth of the first trench 12. However, the present invention is not limited to this.

Next, step S18 is preformed to form a source region 16 in the second well 15. The source region 16 is doped with n-type dopants. Afterward, step S19 is preformed to form the inter-level dielectric layer 17 for covering the first region 1100 of the top surface 110 of the epitaxial layer 11. The inter-level dielectric layer 17 deposited on the epitaxial layer 11 may be a USG layer or a BPSG layer. Afterward, a lithographic and etching method is used to form a contact via in the inter-level dielectric layer 17. Finally, step S20 is preformed to form the metal layer 18 on the epitaxial layer 11 and the inter-level dielectric layer 17 for connecting to the source region 16 through the contact via so as to complete the power MOSFET structure as shown in FIG. 1.

In contrast with the typical high efficiency power MOSFET, which needs complicated and expensive fabrication processes to form a deep p-type doped region under the gate trench, the power MOSFET of the present invention is fabricated without the need of complicated processes such as high-energy ion implantation process or expensive equipments, so that the manufacturing cost of the power MOSFET can be efficiently decreased. Meanwhile, the power MOSFET of the invention also features lower on-resistance, which is particularly suitable for electronic products for middle to high voltage power usage and has great potential in the market.

Although the present invention has been illustrated and described with reference to the preferred embodiment thereof, it should be understood that it is in no way limited to the details of such embodiment but is capable of numerous modifications within the scope of the appended claims.

What is claimed is:

1. A power MOSFET, comprising:
   a substrate;
   an epitaxial layer with lower concentration dopants of a first conduction type, formed on the substrate;
   a first trench having an inner wall, extending downward from a first region of a top surface of the epitaxial layer, and a first gate dielectric layer and a gate region composed of a conductive material being formed in the first trench, wherein the first gate dielectric layer is sandwiched between the inner wall of the first trench and the gate region;
   a second trench, extending downward from a bottom of the first trench with a second gate dielectric layer being formed in the second trench, wherein the second trench is smaller than the first trench in width;
   a calabash-shaped first well doped with dopants of a second conduction type, extending from the bottom of the first trench to and beyond the bottom of the second trench, and surrounding a sidewall and the bottom of the second trench, wherein the second conduction type is opposite to the first conduction type;
   a second well with dopants of the second conduction type, extending downward from a second region of the top surface of the epitaxial layer, wherein the second well and the first well are separated from each other; and
   a source region with dopants of the first conduction type located within the second well.

2. The power MOSFET of claim 1, wherein the depth of the second well is smaller than a half of the depth of the first trench.

3. The power MOSFET of claim 1, wherein the width of the second trench is in a range of 40% to 80% of the width of the first trench.

4. The power MOSFET of claim 1, wherein the depth of the second trench is in a range of 20% to 50% of the depth of the first trench.

5. The power MOSFET of claim 1, wherein the second trench is fully filled with the second gate dielectric layer and the bottom of the first trench is covered by the second gate dielectric layer.

* * * * *